March 6, 1951 L. E. BARTON 2,544,211

VARIABLE IMPEDANCE DEVICE

Filed May 18, 1949

Inventor

LOY E. BARTON

By H. W. Newton

Attorney

Patented Mar. 6, 1951 2,544,211

UNITED STATES PATENT OFFICE 2,544,211

VARIABLE IMPEDANCE DEVICE

Loy E. Barton, Princeton, N. J., assignor to Radio Corporation of America, a corporation of Delaware Application May 18, 1949, Serial No. 94,006

8 Claims. (Cl. 178—44)

This invention relates generally to variable impedance devices for signal conveying circuits and the like, and more particularly to control devices or circuit impedances which are adapted for variable control in such circuits for signal attenuation and gain control purposes.

The three-electrode semi-conductor is a recent development in the field of electric amplification. This device has been termed a "transistor," and its essential characteristics have been disclosed in a series of three letters to the "Physical Review" by Bardeen and Brattain, Brattain and Bardeen, and Shockley and Pearson which appear on pages 230 to 233 of the July 15, 1948, issue. The new amplifier includes a block of semi-conducting material such as silicon or germanium which is provided with two closely adjacent point electrodes called "emitter" and "collector" electrodes in contact with one surface region of the semi-conducting material, and a "base" electrode which provides a large-area, low-resistance contact with another surface region of the semi-conducting material. The input circuit of the amplifier described in the publication referred to above is connected between the emitter electrode and the base electrode while the output circuit is connected between the collector electrode and the base electrode. The base electrode is therefore the common input and output electrode and may be grounded.

In accordance with the present invention it has been found that the impedance looking into one of the electrodes of a semi-conductor amplifier may be made to vary over a wide range by varying the bias potential applied between two of the electrodes. Such a variable impedance device may be utilized in an attenuation circuit or for controlling signal amplitude generally. Through its use in proper circuits, for example, manual volume control and remote gain control may effectively be attained.

It is the principal object of the present invention, therefore, to provide a novel variable impedance device including a three-electrode semi-conductor which is adapted for use in various signal circuits as a controlling element.

A further object of the invention is to provide a variable control device and attenuation circuit therefor, suitable for volume control and the like purposes, which utilizes the variation of the resistance of a three-electrode semi-conductor caused by variation of a bias or control voltage.

Another object of the invention is to provide a variable resistor device, the resistance of which can be varied over a wide range by variation of a bias or control voltage over a very small range.

In accordance with the present invention, it has been found that the resistance looking into the collector electrode of a semi-conductor amplifier depends upon the bias voltage applied between the emitter and base electrodes of the amplifier. Thus, when this bias voltage is varied over a range of less than one volt, the resistance looking into the collector electrode may vary between thirty thousand and less than a thousand ohms. Accordingly, a semi-conductor amplifier may be used, for example, as a variable resistor in an L pad attenuation circuit, which is well known.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
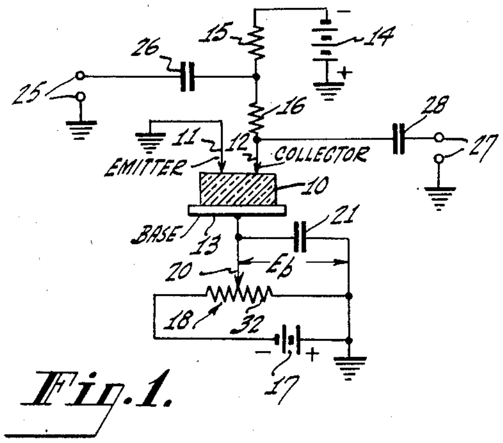
Figure 1 is a circuit diagram of a variable impedance device including a three-electrode semi-conductor in accordance with the present invention and arranged as an attenuation circuit for controlling the amplitude of a signal.

Referring now to the drawing, in which like components have been designated by the same reference numerals throughout the figures, and particularly to Figure 1, there is illustrated a signal amplitude control system in accordance with the invention. The control system includes a semi-conductor device consisting of semi-conducting body 10 which may consist of boron, silicon, germanium, tellurium, selenium containing a small but sufficient number of atomic impurity centers or lattice imperfections as commonly employed for best results in crystal rectifiers. Germanium is the preferred material for semi-conducting body 10 and may be prepared so as to be an electronic N type semi-conductor. The germanium semi-conducting body is usually polished and etched as is well known and as described for example in the papers referred to as well as in the recent publication by Webster, Eberhard and Barton which appears in the March 1949 issue of RCA Review on pages 5–16.

Semi-conducting body 10 is provided with emitter electrode 11, collector electrode 12 and base electrode 13. Emitter electrode 11 and collector electrode 12 form small-area contacts with semi-conducting body 10 and may consist, for example, of point electrodes of tungsten or Phosphor-bronze wires having a diameter of 2 to 5 mils and spaced apart less than 5 mils. Emitter electrode 11 and collector electrode 12 may be provided on the same surface of semi-conducting body 10 or they may be arranged on opposite surfaces of semi-conducting body 10 spaced apart a few mils. Base electrode 13 forms a large-area low resistance contact with the bulk of semi-conducting body 10.

Emitter electrode 11 may be grounded as shown. A suitable source of potential such as battery 14 has its positive terminal grounded while its negative terminal is connected to collector electrode 12 through resistors 15 and 16 arranged in series. Another source of potential such as battery 17 has its positive terminal grounded while its negative terminal is connected to ground through potentiometer 18 provided with a variable tap 20 connected to base electrode 13. Base electrode 13 may be bypassed to ground for alternating currents through capacitor 21 connected between tap 20 and ground. Base electrode 13 is accordingly grounded for alternating currents.

Battery 14 applies a comparatively large reverse bias voltage between collector electrode 12 and base electrode 13. Battery 17 applies a comparatively small forward bias between base electrode 13 and ground or emitter electrode 11 which is at ground potential.

In accordance with the present invention an input signal is impressed on input terminals 25, one of which is grounded while the other one may be coupled to the junction point between resistors 15, 16 through coupling capacitor 25. The output signal may be obtained from output terminals 27, one of which is grounded while the other one is coupled to collector electrode 12 through coupling capacitor 28.

Figure 3:
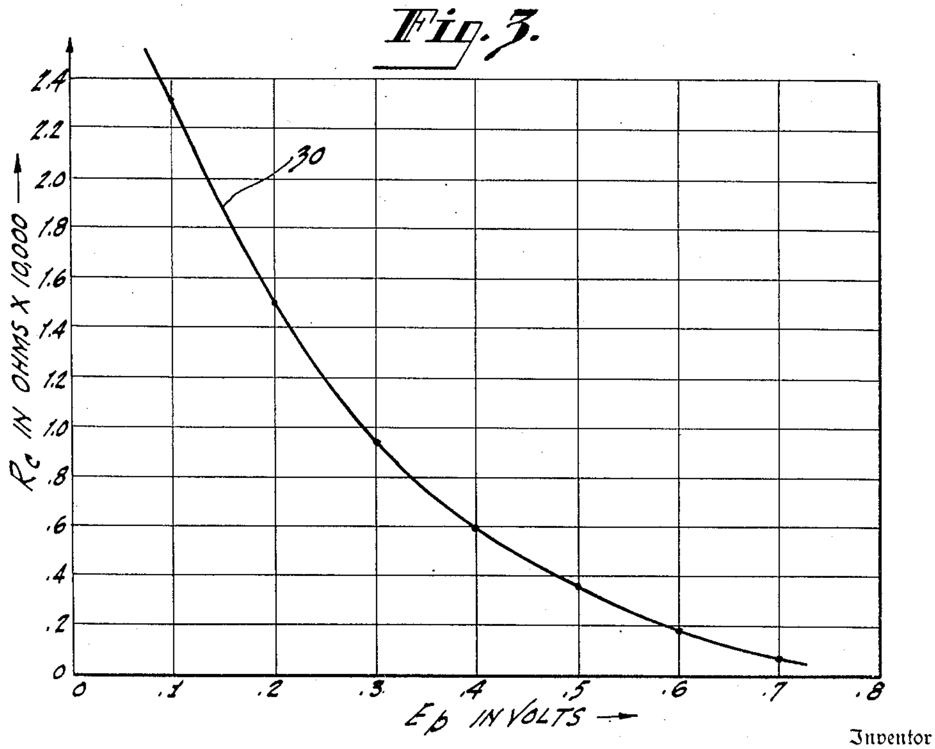
Figure 3 is a curve showing the variation of the resistance looking into the collector electrode with a variation of the bias voltage between the emitter and base electrodes.

As illustrated by curve 30 of Figure 3 the resistance $R_c$ which is the resistance looking into collector electrode 12, varies with the bias voltage $E_b$ which as illustrated in Figure 1, is the bias voltage between base electrode 13 and ground or emitter electrode 11. If $E_b$ is varied, this will also change the bias voltage between collector electrode 12 and base electrode 13. For a bias voltage $E_b$ in the neighborhood of zero volts $R_c$ has been found to have a resistance of 30,000 ohms. On the other hand, $R_c$ may be reduced to 500 ohms or less if the bias voltage $E_b$ is increased to a value above .7 volt. Thus, with a very small variation of $E_b$ a resistance variation between 30,000 ohms and considerably less than 1,000 ohms may be obtained. That is a range of almost 60 to 1. It is to be understood, however, that the exact shape of curve 30 as well as the actual resistance values of $R_c$ depend to a certain extent on the characteristics of the semi-conductor device and will be different for different units.

Figure 2:
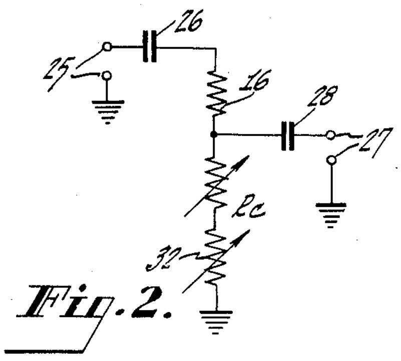
Figure 2 is a simplified or equivalent circuit diagram of the circuit of Figure 1.

Referring now to Figure 2, a simplified circuit diagram of the control system of Figure 1 has been shown. The input signal impressed on input terminals 25 is applied effectively across resistors 16, $R_c$ and 32 connected in series, where resistor 32 is the variable portion of potentiometer 18 provided between ground and tap 20. The output signal derived from output terminals 27 is effectively obtained across resistors $R_c$ and 32 connected in series. The circuit of Figure 2 is essentially an L pad filter or attenuation circuit wherein resistors $R_c$ and 32 bypass a variable and controllable portion of the input signal to ground.

The resistance of resistor 16 may amount to 15,000 ohms and the voltage of battery 17 may be 1.5 volts. The resistance of resistor 32 is so small as to be negligible. If the resistance of $R_c$ amounts to 30,000 ohms, the amplitude of the output signal will be 66 per cent of that of the input signal. If the resistance of $R_c$ amounts to 1,000 ohms the amplitude of the output signal will be 6 per cent of that of the input signal. Finally, if $R_c$ is reduced to 500 ohms the amplitude of the output signal will be reduced to 3 per cent of that of the input signal.

It will accordingly be seen that the control system of Figure 1 provides for a wide-range sensitive control of the amplitude of a signal. The input signal to be attenuated should have an amplitude not exceeding 10 volts and should preferably be of the order of one volt or less. It is to be understood that the voltage of the input signal should be well above the noise factor. It is furthermore to be understood that the resistance of resistor 15 should be large compared to that of resistor 16. It is also feasible to apply the input signal between ground and the positive terminal of battery 14 in which case resistor 15 may be omitted. In every case, the input signal is effectively applied between resistor 16 and ground.

There has thus been disclosed a variable impedance device including a three-electrode semiconductor. The resistance looking into the collector electrode may be varied over a wide range by varying the bias voltage applied between the emitter and base electrodes over a very small range. The variable impedance device of the invention may be used as an attenuation circuit in which case the amplitude of an input signal may be controlled. Thus, the control system of the invention may be used to effect manual volume control.

What is claimed is:

1. A variable attenuation circuit comprising a semi-conducting body, a base electrode, an emitter electrode and a collector electrode in contact with said body, an impedance element, a first source of voltage connected in series with said impedance element between said collector electrode and a point of relatively fixed potential for applying a reverse bias between said collector and base electrodes, a second source of voltage connected between said emitter and base electrodes for applying a forward bias voltage therebetween, means for impressing an input signal effectively between said element and said point of fixed potential, means for deriving an output signal effectively between said collector and base electrodes, and means for varying said forward bias voltage, whereby the impedance looking into said collector electrode is varied.

2. A variable attenuation circuit comprising a semi-conducting body, a base electrode, an emitter electrode and a collector electrode in contact with said body, an impedance element, a first source of voltage connected in series with said impedance element between said collector and emitter electrodes for applying a reverse bias between said collector and base electrodes, a second source of voltage connected between said emitter and base electrodes for applying a forward bias therebetween, means for impressing an input signal on said element, means for deriving an output signal effectively between said collector and base electrodes, and means for varying the voltage of said second source, whereby the impedance looking into said collector electrode is varied.

3. A signal amplitude control system comprising a semi-conducting body, a base electrode, a collector electrode and an emitter electrode in contact with said body, means including a first source of potential for applying a reverse bias potential between said collector and base electrodes, means including a second source of potential for applying a forward bias potential between said emitter and base electrodes, an impedance element connected to said collector electrode, means for impressing an input signal between the free end of said element and a point of relatively fixed potential, means for varying the potential of said second source to vary said forward bias voltage, and means for deriving an output signal effectively across said collector and base electrodes, said output signal having an amplitude dependent upon said forward bias voltage.

4. A signal amplitude control system comprising a semi-conducting body, a base electrode, a collector electrode and an emitter electrode in contact with said body, a first source of potential connected for applying a reverse bias potential between said collector and base electrodes, a second source of potential connected for applying a forward bias potential between said emitter and base electrodes, an impedance element connected to said collector electrode, an input circuit for impressing an input signal between the free end of said element and a point of relatively fixed potential, means for varying the potential of said second source to vary said forward bias voltage, and an output circuit for deriving an output signal effectively across said collector and base electrode, said output signal having an amplitude dependent upon said forward bias voltage.

5. A signal amplitude control system comprising a pair of input terminals, means for impressing an input signal thereon, a first fixed resistor and a second variable resistor connected serially between said input terminals, and a pair of output terminals connected across said variable resistor for deriving an output signal of an amplitude determined by the ratio of the resistances of said resistors; said variable resistor including a semi-conducting body, a base electrode, a collector electrode and an emitter electrode in contact with said body, and means for applying a predetermined reverse bias voltage between said collector and base electrodes and for applying a variable forward bias voltage between said emitter and base electrodes, the resistance of said second variable resistor being determined by said forward bias voltage, said output terminals being connected effectively between said collector and base electrodes.

6. A signal amplitude control system comprising a pair of input terminals, means for impressing an input signal thereon, a first fixed resistor and a second variable resistor connected serially between said input terminals, and a pair of output terminals connected across said variable resistor for deriving an output signal of an amplitude determined by the ratio of the resistances of said resistors; said variable resistor including a semi-conducting body, a base electrode, a collector electrode and an emitter electrode in contact with said body, means including a source of voltage for applying a predetermined reverse bias voltage between said collector and base electrodes and for applying a variable forward bias voltage between said emitter and base electrodes, and means for varying said forward bias voltage, the resistance of said second variable resistor being determined by said forward bias voltage, said output terminals being connected effectively between said collector and base electrodes.

7. A signal amplitude control system comprising a semi-conducting body, a base electrode, a collector electrode and an emitter electrode contacting said body, a first resistor, a first source of potential connected serially with said resistor between said collector electrode and a point of fixed potential for applying a predetermined reverse bias potential between said collector and base electrodes, said emitter electrode being maintained at a fixed potential, a second source of potential having one terminal connected to said point of fixed potential, a second resistor connected across said second source, a variable tap on said second resistor connected to said base electrode for applying a variable forward bias between said emitter and base electrodes, means for applying an input signal between said first resistor and a point of fixed potential, and means for deriving an output signal between said collector and emitter electrodes, the amplitude of said output signal being a portion of that of said input signal determined by the position of said variable tap.

8. A signal amplitude control system comprising a semi-conducting body, a base electrode, a collector electrode and an emitter electrode contacting said body, a first resistor, a first source of potential connected serially with said resistor between said collector electrode and a point of fixed potential for applying a predetermined reverse bias between said collector and base electrodes, said emitter electrode being maintained at a fixed potential, a second source of potential having one terminal connected to said point of fixed potential, a second resistor connected across said second source, a variable tap on said second resistor connected to said base electrode for applying a variable forward bias between said emitter and base electrodes, an input circuit connected between said first resistor and a point of fixed potential for applying an input signal between said resistor and base electrode, and an output circuit connected between said collector electrode and a point of fixed potential for deriving an output signal, the amplitude of said output signal being a portion of that of said input signal determined by the position of said variable tap.

LOY E. BARTON.

REFERENCES CITED

The following references are of record in the file of this patent:

UNITED STATES PATENTS

| Number | Name | Date |
|---|---|---|
| 2,085,905 | Friedrich | July 6, 1937 |
| 2,476,323 | Rack | July 19, 1949 |
| 2,486,776 | Barney | Nov. 1, 1949 |